United States Patent [19]

Ogata

[11] Patent Number: 5,262,721

[45] Date of Patent: Nov. 16, 1993

[54] ELECTRONIC CIRCUIT TESTING APPARATUS AND TESTING METHOD USING THE SAME

[75] Inventor: Teruaki Ogata, Itami, Japan

[73] Assignee: Mitsubishi Denki Kabushiki Kaisha, Tokyo, Japan

[21] Appl. No.: 877,136

[22] Filed: May 1, 1992

[30] Foreign Application Priority Data

May 2, 1991 [JP] Japan ................................ 3-100249

[51] Int. Cl.⁵ ............................................. G01R 27/04
[52] U.S. Cl. ................................. 324/158 R; 324/73.1
[58] Field of Search ................ 324/158 R, 73.1, 537, 324/538, 539, 500; 371/15.1, 16.1; 364/551.01; 437/8

[56] References Cited

U.S. PATENT DOCUMENTS

| | | | |
|---|---|---|---|
| 3,705,349 | 12/1972 | Arnold | 324/538 |
| 3,728,616 | 4/1973 | Cheek et al. | 324/538 |
| 4,326,162 | 4/1982 | Hankey | 324/538 |
| 5,057,772 | 10/1991 | Bruno et al. | 324/158 P |

*Primary Examiner*—Vinh Nguyen
*Attorney, Agent, or Firm*—Oblon, Spivak, McClelland, Maier & Neustadt

[57] ABSTRACT

Voltage and current sources are provided in one-to-one correspondence to all the input-output terminals of a testee circuit that can be used for testing. According to a test control program, a control unit controls supply and detection of voltage and current performed by the voltage and current sources, declares connections of the input-output terminals with the voltage and current sources, rearranges data corresponding to the supply and detection operations of the voltage and current sources based on such declaration; and displays, in a display, information on hardware corresponding connections and information on connections of an electronic circuit in correspondence therebetween.

5 Claims, 3 Drawing Sheets

ELECTRONIC CIRCUIT TESTING APPARATUS AND TESTING METHOD USING THE SAME

BACKGROUND OF THE INVENTION

1. Field of the Invention

The present invention relates to an apparatus for testing electronic circuits, such as semiconductor circuits, and a testing method using the apparatus.

2. Description of the Related Art

FIG. 2 illustrates construction of a conventional electronic circuit testing apparatus. Voltage and current sources 1 (referred to as "power sources" hereinafter) apply voltages or currents to a testee circuit 4 and detect the currents or voltages which occur in the testee circuit 4. Thus, the power sources 1 have the function of testers. The testee circuit 4 is an electronic circuit, such as a semiconductor device (an IC package, etc.), and has terminals a to f. The power sources 1 are connected to a switching circuit 3 by their respective on-off switches 2. The testee circuit 4 is placed on a testing peripheral circuit 5. Lines from the power sources 1 and lines from input-output terminals 5a of the testing peripheral circuit 5 are wired in a matrix arrangement on the switching circuit 3. Many select switches 3a are arranged in the matrix and connect the lines from the power sources 1 to the lines from the input-output terminals 5a. The power sources 1 can be connected to desired input-output terminals 1 by operating selected switches 3a. The testing peripheral circuit 5 tests the testee circuit 4 and comprises resistors, capacitors, etc. (not shown), which are required for the test. The input-output terminals 5a are connected to the predetermined terminals a to f of the testee circuit 4. A control unit 6 is composed of, for example, a personal computer. According to a test control program 10 thereof, the control unit 6 controls voltage or current levels of the power sources 1 and the operation of the on-off switches 2 of the power sources 1 and the select switches 3a of the switching circuit 3.

Operation of the electronic circuit testing apparatus will now be described. The control unit 6 designates test conditions, for example, the level of supplied voltage if current is to be detected or the level of supplied current if voltage is to be detected. The power sources 1 supply voltage or current of the designated levels to a testee circuit 4 through the on-off switches 2, switching circuit 3 and the testing peripheral circuit 5. The on-off switches 2 and the select switches 3a of the switching circuit 3 are operated so that the designated levels of voltage or current are supplied to desired terminals a to f of the testee circuit 4 and that the levels of current or voltage at the desired terminals a to f are detected.

In a conventional electronic circuit testing apparatus constructed as above, the power sources 1 supply current or voltage to and detect voltage or current from the input-output terminals of the testing peripheral circuit which are selected solely by operation of the on-off switches and the select switches of the switching circuit. Therefore, it is troublesome to change the connections between the terminals of a testee circuit and the input-output terminals of the testing peripheral circuit. The test control program must be rewritten, or the hardware connections between the input-output terminals and the testee circuit must be changed. Also, the test control program or the testing peripheral circuit must be changed to test electronic circuits which have different connections to the input-output terminals even though the electronic circuits have the same function.

SUMMARY OF THE INVENTION

The present invention is to solve the above-mentioned problems. It is an object of the present invention to provide an electronic circuit testing apparatus in which data is rearranged in the test control program, using information provided when the test control program declares the terminals to be connected, so as to equivalently change the connections between the terminals of the testing circuit and the terminals of a testee circuit, without changing hardware connections. It is another object of the present invention to provide a testing method using the apparatus.

In an electronic circuit testing apparatus according to the present invention, voltage and current sources are provided in one-to-one correspondence to all the terminals of a testee circuit that can be used as input-output terminals for the test, and each of the voltage and current sources is provided with a power controller which comprises, for example, a micro-controller, and controls the voltage and current source. Further, the power controllers are connected to a terminal connection controller which changes control data in each of the power controllers according to terminal connection declaration information. Still further, a display is provided which shows the correspondence between hardware connection information of the testing apparatus and connection information of the terminals of a testee circuit. The present invention also includes the testing method.

According to the present invention, control means, including the power controllers and the terminal connection controller, changes the connections between the voltage and current sources and the terminals of a testee circuit equivalently in the test control program by using terminal connection declaration information. Also, display means including the display shows the operator the information on connections corresponding to the hardware of the testing apparatus and the information on connections to a testee circuit.

Further objects, features and advantages of the present invention will become apparent in the following description of the preferred embodiment with reference to the attached drawings.

DESCRIPTION OF THE PREFERRED EMBODIMENT

The preferred embodiment of the present invention will now be described hereinafter with reference to the drawings.

Figure 1:
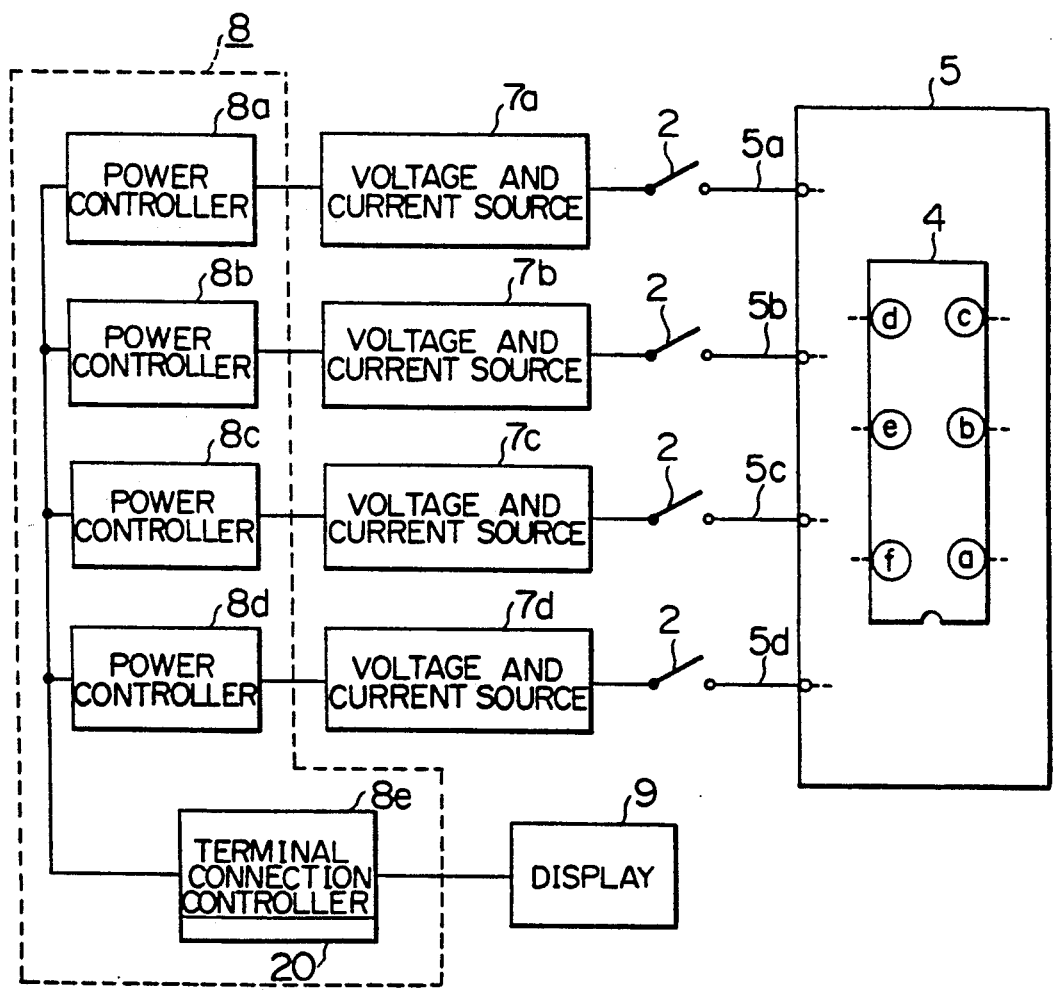
FIG. 1 is a block diagram of an electronic circuit testing apparatus according to one embodiment of the present invention.

Referring to FIG. 1, voltage and current sources (referred to as "power sources" hereinafter) 7a to 7d supply voltage and detect current or supply current and detect voltage. The power sources 7a to 7d correspond to input-output terminals 5a to 5d, respectively, of a testing peripheral circuit 5, which is connected to a testee electronic circuit 4, such as an IC package. A control unit 8 separately controls the power source 7a to 7d according to a test control program 20 stored therein. The control unit 8 comprises: power controllers 8a to 8d including micro-controllers, etc., which are connected to the power sources 7a to 7d, respectively; and a terminal connection controller 8e connected to all the power controllers 8a to 8d. The terminal connection controller 8e is composed of, for example, a personal computer, and stores the above-mentioned test program 20.

The power sources 7a to 7b supply voltage or current according to data about the supply sent from the corresponding power controllers 8a to 8d. Then, power sources 7a to 7d detect current or voltage according to data about the detection and send data of the detected current or voltage to the corresponding power controllers 8a to 8d. On-off switches 2 of the power sources 7a to 7d operate according to the control of their respective power controllers 8a to 8d, corresponding to the operations of the power sources 7a to 7d. The terminal connection controller 8e provides the power controllers 8a to 8d with data about the connections of the input-output terminals 5a to 5d. A display 9 displays the correspondence between the information on connection of the input-output terminals on the hardware and the description for hardware designation on the test control program during debugging of the test control program.

The data designated for the power sources 7a to 7d is data to control application, i.e., supply, and detection of voltage or current. Such data is described in program language unique to each electronic circuit testing apparatus and is controlled by the power controllers 8a to 8d. According to the present invention, since both the power sources 7a to 7d and the power controllers 8a to 8d are provided, in principle, in one-to-one correspondence to the input-output terminals 5a to 5d, the input-output terminals 5a to 5d can be separately controlled.

To set voltages of 1 V, 2 V, 3 V and 4 V for the input-output terminals 5a, 5b, 5c and 5d, respectively, a description is made in the test control program in the program language so that the power controllers 8a to 8d and the power sources 7a to 7d corresponding to the input-output terminals 5a to 5d are set at 1 V, 2 V, 3 V and 4 V. The program description is made such that if hardware-corresponding power sources are set as A, B, C and D, A=1 V, B=2 V, C=3 V and D=4 V are set in the program language.

To change the settings of the input-output terminals to 5a=2 V, 5b=3 V, 5c=4 V and 5d=1 V, the terminal connection controller 8e decodes the terminal connection declaration information described in the test control program and changes the data of the power controllers 8a to 8d to 5a=B, 5b=C, 5c=D and 5d=A. In other words, data are set for the power controllers 8a to 8d as follows: B=2 V for the power controller 8a; C=3 V for the power controller 8b; D=4 V for the power controller 8c; and A=1 V for the power controller 8d. Thus, test conditions can be easily changed without having to change any description regarding the power sources 7a to 7d in the test control program. The display 9 receives from the terminal connection controller 8e the hardware correspondence (designation by program description) and the connection information of the input-output terminals 5a to 5d, and it displays the correspondence therebetween. Thus, since the operator can easily verify the correspondence and connections, the terminal connection change can be easily carried out without losing the efficiency of debugging the test control program.

The above operation will be described in detail based on the concept of terminal connection declaration information. If the input-output terminals 5a to 5d of the testing peripheral circuit 5 are connected to terminals a to d of the testee circuit 4 in FIG. 1, and if a test is carried out by supplying the terminal a to d with 1 V, 2 V, 3 V and 4 V, respectively, settings are made as shown in Table 1.

TABLE 1

| Input-Output Terminal | 5a | 5b | 5c | 5d |
|---|---|---|---|---|
| Power Controller | 8a | 8b | 8c | 8d |
| Power Source Name | A | B | C | D |
| Terminal | a | b | c | d |
| Supplied Voltage | 1 V | 2 V | 3 V | 4 V |

As shown in Table 1, the power controller 8a is designated as the power source A which is connected to the terminal a of the testee circuit 4. This designation of the power source A includes data of the connection to the terminal a and the supply of voltage of 1 V. In the same way, the power controller 8b is designated as the power source B which is connected to the terminal b and is set with the data of the connection to the terminal b and the supply of voltage of 2 V. The power controller 8c is designated as the power source C which is connected to the terminal c and is set with the data of the connection to the terminal c and the supply of voltage of 3 V. The power controller 8d is designated as the power source D which is connected to the terminal d and is set with the data of the connection to the terminal d and the supply of voltage of 4 V.

Figure 1A:
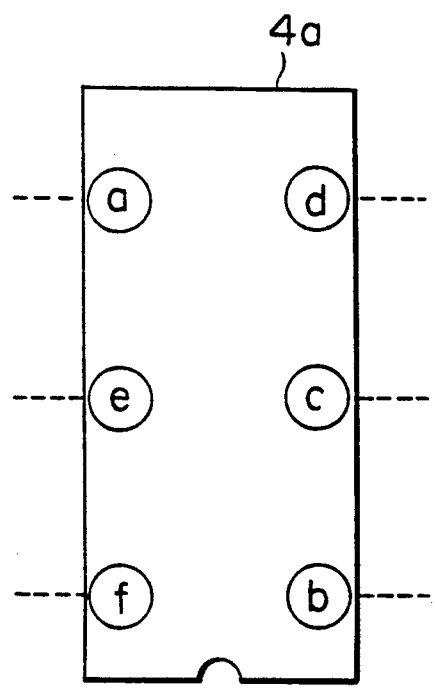
FIG. 1A is a schematic illustration of a testee circuit whose terminals are arranged differently from those of the testee circuit shown in FIG. 1.
Figure 2:
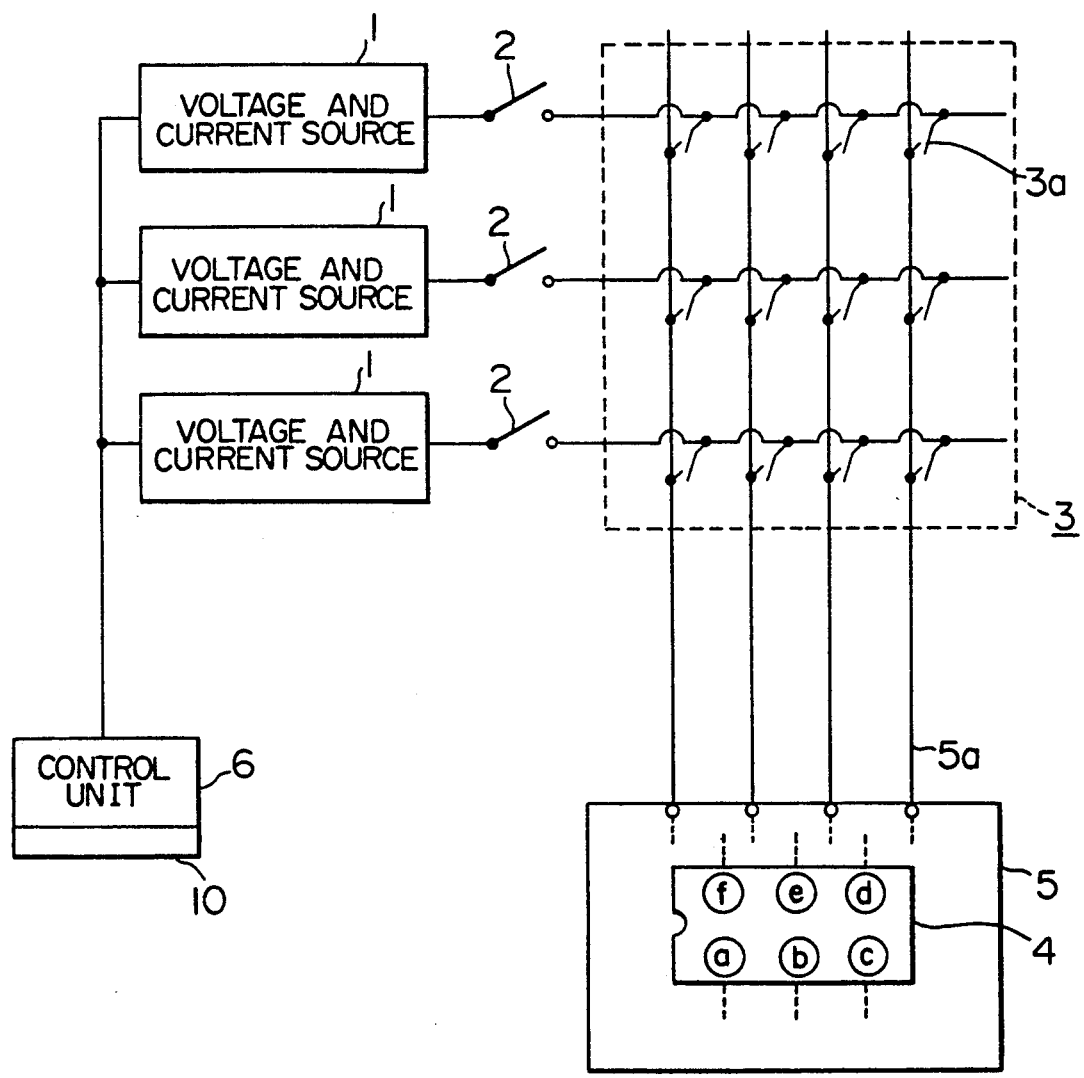
FIG. 2 is a block diagram of a conventional electronic circuit testing apparatus.

If a testee circuit 4a shown in FIG. 1A, having terminals arranged differently from the terminals of the testee circuit 4, is connected to the testing peripheral circuit 5 in the same position, settings are made as shown in Table 2, according to the present invention.

TABLE 2

| Input-Output Terminal | 5a | 5b | 5c | 5d |
|---|---|---|---|---|
| Power Controller | 8a | 8b | 8c | 8d |
| Power Source Name | B | C | D | A |
| Terminal | b | c | d | a |
| Supplied Voltage | 2 V | 3 V | 4 V | 1 V |

The power controller 8a is designated as the power source B which is connected to the terminal b of the testee circuit 4a. This designation of the power source B includes data of the connection to the terminal b and the supply of voltage of 2 V. In the same way, the power controller 8b is designated as the power source C, the power controller 8c as the power source D, and the power controller d as the power source A. The designation of each power controller as a power source is made by decoding the terminal connection declaration information which is described in the corresponding test control program. The display 9 shows the connections between the terminals of the testee circuit 4a and the input-output terminals of the peripheral circuit 5 as well as the voltages supplied thereto, as shown in Table 3. Thus, the operator can verify the connections.

TABLE 3

| Terminal | a | b | c | d |
|---|---|---|---|---|
| Supplied Voltage | 1 V | 2 V | 3 V | 4 V |
| Input-Output Terminal | 5d | 5a | 5b | 5c |

Although, in the above embodiment, the terminal connection controller 8e controls data regarding the power controllers 8a to 8d, practically the same function can be obtained by a method in which the description of the test control program is entirely changed according to terminal connection declaration information if the functions of the power controllers 8a to 8d, the power sources 7a to 7d and the display 9 are the same as in the above embodiment.

According to the electronic circuit testing apparatus of the present invention, since the connections of the power sources can be easily and equivalently changed, testing of electronic circuits can be continued without rewriting the test control program or changing the hardware connections of the input-output terminals. Therefore, even if the electronic circuits to be tested have different arrangements of terminals or if different types of electronic circuits are tested simultaneously, programming of the test control is easy.

While the present invention has been described with respect to what is presently considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. An electronic circuit testing apparatus for testing electrical characteristics of an electronic circuit having at least one input-output terminal, comprising:

voltage and current sources which are provided in a one-to-one correspondence to all the input-output terminals of the electronic circuit, said voltage and current sources supplying said input-output terminals with voltage or current and detecting current or voltage that occurs at said input-output terminals; and control means which stores a test control program and which, according to said test control program, controls the supplying and detecting of voltage and current performed by each of said voltage and current sources, determines connections of said input-output terminals with said voltage and current sources, and rearranges data corresponding to the supplying and detecting operations of said voltage and current sources based on such determined connections.

2. An electronic circuit for testing apparatus according to claim 1, further comprising display means for displaying information on connections of the input-output terminals of the electronic circuit and the voltage and current sources.

3. An electronic circuit testing apparatus according to claim 1, further comprising power controllers, wherein one power controller is connected to a corresponding voltage and current source.

4. An electronic circuit testing apparatus according to claim 2, further comprising power controllers, wherein one power controller is connected to a corresponding voltage and current source.

5. An electronic circuit testing method for testing electrical characteristics of an electronic circuit having at least one input-output terminal, in which method connections of the terminals are changed without changing connections in the hardware of an electronic circuit testing apparatus comprising: voltage and current sources which are provided in one-to-one correspondence to all the input-output terminals of the electronic circuit and which supply said input-output terminals with voltage or current and detect current or voltage that occurs at said input-output terminals; and control means for controlling, according to a test control program, supply and detection of voltage and current performed by said voltage and current sources, which method comprises the steps of:

determining connections of said input-output terminals with said voltage and current sources;

rearranging data corresponding to the supply and detection operations of said voltage and current sources based on such determined connections; and displaying information on connections of the input-output terminals of the electronic circuit and the voltage and current sources.

* * * * *